United States Patent
Lee et al.

(10) Patent No.: US 10,608,173 B2
(45) Date of Patent: Mar. 31, 2020

(54) ION BEAM APPARATUS WITH CONTINUOUSLY CHANGING PARAMETER CONTROL

(71) Applicant: Samsung Electronics Co., Ltd., Suwon-si, Gyeonggi-do (KR)

(72) Inventors: Yil-hyung Lee, Hwaseong-si (KR); Jong-Kyu Kim, Seongnam-si (KR); Jongchul Park, Seongnam-si (KR); Sang-Kuk Kim, Seongnam-si (KR); Jongsoon Park, Suwon-si (KR); Hyeji Yoon, Pyeongtaek-si (KR); Woohyun Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/284,439

(22) Filed: Feb. 25, 2019

(65) Prior Publication Data
US 2019/0189916 A1   Jun. 20, 2019

Related U.S. Application Data

(63) Continuation of application No. 15/608,212, filed on May 30, 2017, now Pat. No. 10,276,788.

(30) Foreign Application Priority Data

Sep. 5, 2016  (KR) .......................... 10-2016-0114003

(51) Int. Cl.
*H01L 43/12*  (2006.01)
*H01L 27/22*  (2006.01)

(52) U.S. Cl.
CPC ............ *H01L 43/12* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 9,070,869 B2 | 6/2015 | Jung et al. | |
| 9,166,154 B2 | 10/2015 | Satoh et al. | |
| 9,246,082 B2 | 1/2016 | Tokashiki | |
| 2003/0085197 A1 | 5/2003 | Tanaka | |
| 2005/0126905 A1* | 6/2005 | Golovchenko | B24B 37/013 204/192.34 |

(Continued)

FOREIGN PATENT DOCUMENTS

| | | |
|---|---|---|
| JP | 2917993 B1 | 7/1999 |
| JP | 2002158211 A | 5/2002 |
| KR | 20090121982 A | 11/2009 |

*Primary Examiner* — Lex H Malsawma
(74) *Attorney, Agent, or Firm* — Harness, Dickey & Pierce, P.L.C.

(57) ABSTRACT

An ion beam apparatus may include a chamber assembly configured to hold a material and direct an ion beam on the material, a detector configured to detect a signal generated from the material based on the ion beam being directed on the material, and a controller configured to control at least one parameter associated with the chamber assembly based on the signal, such that at least one of an ion energy associated with the ion beam, an ion current associated with the ion beam, and an incident angle of the ion beam with respect to a top surface of the material is changed continuously with time.

13 Claims, 12 Drawing Sheets

(56) References Cited

U.S. PATENT DOCUMENTS

| | | | |
|---|---|---|---|
| 2007/0238031 A1* | 10/2007 | Lee | H01L 21/0337 430/5 |
| 2008/0302979 A1 | 12/2008 | Kozakai | |
| 2015/0090583 A1* | 4/2015 | Kodaira | H01J 37/32357 204/192.34 |
| 2015/0104882 A1 | 4/2015 | Jung et al. | |
| 2015/0287911 A1 | 10/2015 | Kim et al. | |
| 2016/0005957 A1 | 1/2016 | Kodaira et al. | |
| 2016/0111294 A1 | 4/2016 | Berry, III et al. | |

* cited by examiner

ION BEAM APPARATUS WITH CONTINUOUSLY CHANGING PARAMETER CONTROL

CROSS-REFERENCE TO RELATED APPLICATIONS

This is a continuation of U.S. non-provisional patent application Ser. No. 15/608,212, filed on May 30, 2017, which claims priority under 35 U.S.C. § 119 to Korean Patent Application No. 10-2016-0114003, filed on Sep. 5, 2016, in the Korean Intellectual Property Office, the disclosure of each of which is hereby incorporated by reference in its entirety.

BACKGROUND

Example embodiments of the inventive concepts relate to ion beam apparatuses configured to control one or more parameters associated with chamber assemblies in which ion beam etching operations may be performed in such a way that a set-point of the parameter is changed continuously with time, methods for forming patterns using the same, and methods for manufacturing a magnetic memory device using the same.

As high-speed and/or low power consumption electronic devices have been demanded, high-speed and/or low-voltage semiconductor memory devices used therein have also been demanded. Magnetic memory devices, including MRAMs, have been developed as semiconductor memory devices capable of satisfying these demands. The magnetic memory devices may emerge as next-generation semiconductor memory devices because of their high-speed and/or non-volatile characteristics.

In general, a magnetic memory device may include a magnetic tunnel junction (MTJ) pattern. A magnetic tunnel junction pattern may include two magnetic layers and an insulating layer disposed between the two magnetic layers. A resistance associated with the magnetic tunnel junction pattern may be changed based at least in part upon magnetization directions of the two magnetic layers. For example, if and/or when the magnetization directions of the two magnetic layers are anti-parallel to each other, the magnetic tunnel junction pattern may have a high resistance. If and/or when the magnetization directions of the two magnetic layers are parallel to each other, the magnetic tunnel junction pattern may have a low resistance. A magnetic memory device may read/write data by using a difference between these resistance values of the magnetic tunnel junction pattern.

Highly integrated and/or low-power magnetic memory devices have been increasingly demanded with the development of an electronic industry. Thus, research is being conducted to satisfy these demands.

SUMMARY

Some example embodiments of the inventive concepts may provide an ion beam apparatus capable of controlling a parameter in such a way that a set-point of the parameter is changed continuously with time.

Some example embodiments of the inventive concepts may also provide a method for forming patterns, which is capable of inhibiting a lower layer between patterns from being recessed.

Some example embodiments of the inventive concepts may also provide a method for manufacturing a magnetic memory device, which is capable of easily manufacturing a magnetic memory device and of minimizing occurrence of defects.

In some example embodiments, an ion beam apparatus may include: a chamber assembly configured to hold a material, the chamber assembly further configured to direct an ion beam on the material; a detector coupled to the chamber assembly, the detector configured to detect a signal generated from the material held in the chamber assembly based on the ion beam being directed on the material; and a controller coupled to the chamber assembly and the detector, the controller configured to control at least one parameter associated with the chamber assembly based on the signal, such that at least one of an ion energy associated with the ion beam, an ion current associated with the ion beam, and an incident angle of the ion beam with respect to a top surface of the material is changed continuously with time.

In some example embodiments, a method, may include: forming a lower layer and an etch target layer on a substrate; and forming patterns laterally spaced apart from each other on the lower layer based on etching the etch target layer using an ion beam irradiated to a surface of the etch target layer while continuously adjusting at least one of an ion energy associated with the ion beam, an ion current associated with the ion beam, and an incident angle of the ion beam with respect to a top surface of the etch target layer.

In some example embodiments, a method may include: forming a lower interlayer insulating layer on a substrate; forming lower contact plugs that penetrate the lower interlayer insulating layer, such that the lower contact plugs are electrically connected to the substrate; forming a magnetic tunnel junction layer on the lower interlayer insulating layer; and forming magnetic tunnel junction patterns laterally spaced apart from each other on the lower interlayer insulating layer based on etching the magnetic tunnel junction layer using an ion beam irradiated to a surface of the magnetic tunnel junction layer while continuously adjusting at least one of an ion energy associated with the ion beam, an ion current associated with the ion beam and an incident angle of the ion beam with respect to a top surface of the magnetic tunnel junction layer.

In some example embodiments, a method may include: directing an ion beam on a material in a chamber assembly to etch the material; and controlling at least one parameter associated with the chamber assembly to continuously adjust at least one of an ion energy associated with the ion beam, an ion current associated with the ion beam, and an incident angle of the ion beam with respect to a top surface of the material, based on a determined intensity of a signal generated from the material based on the ion beam directed on the material, such that the ion beam etches the material to form a pattern.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, example embodiments of the inventive concepts will be described in detail with reference to the accompanying drawings.

Figure 1:
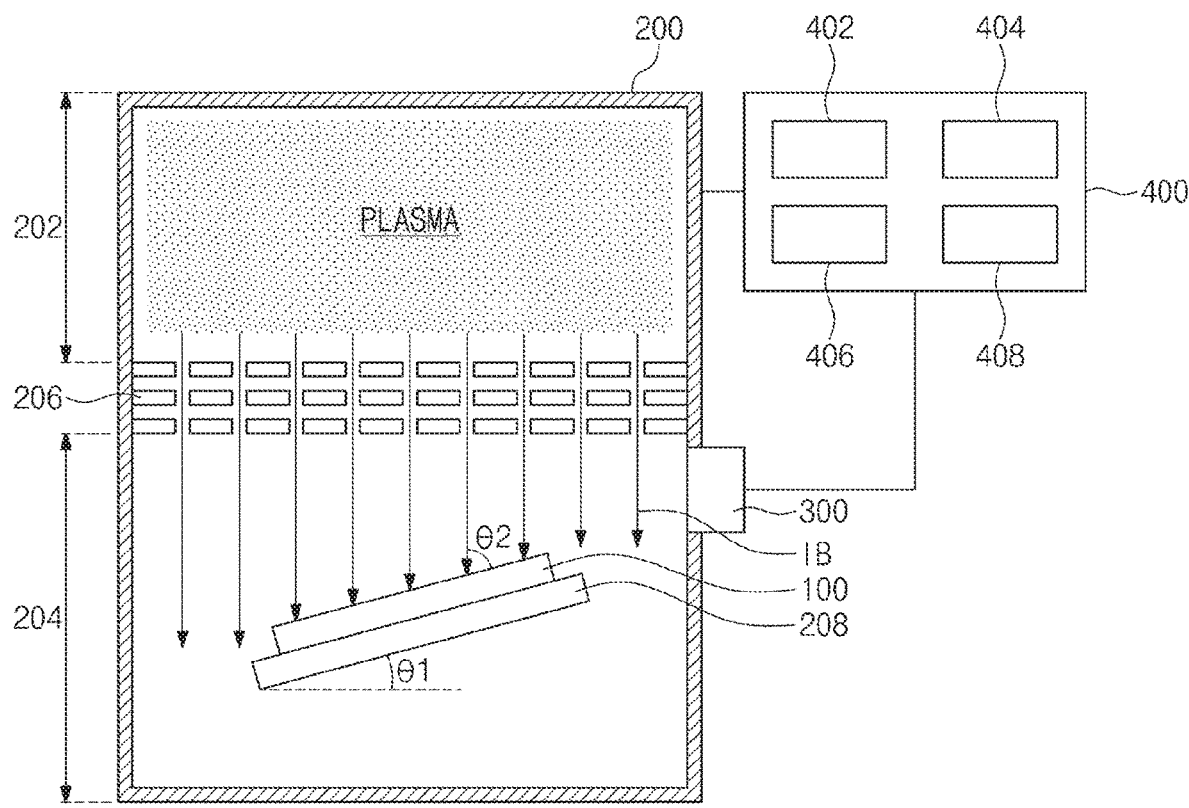
FIG. 1 is a schematic view illustrating an ion beam apparatus according to some example embodiments of the inventive concepts.

FIG. 1 is a schematic view illustrating an ion beam apparatus according to some example embodiments of the inventive concepts. FIG. 2, FIG. 3, FIG. 4, and FIG. 5 are graphs illustrating a method for controlling a parameter of a chamber assembly by a controller of FIG. 1 according to some example embodiments of the inventive concepts.

Referring to FIG. 1, an ion beam apparatus 500 may include a chamber assembly 200 in which a process is performed using an ion beam IB, a detector 300 coupled to the chamber assembly 200, and a computer system 400 connected to the chamber assembly 200 and the detector 300. In some example embodiments, the process performed using the ion beam IB may include an ion beam etching process, also referred to herein as etching of a material based on directing the ion beam IB on the material, also referred to herein as ion beam IB etching. Ion beam IB etching may include etching the material to form a pattern. The pattern may include an MTJ pattern.

Ion beam IB etching may include directing an ion beam IB into a portion of the chamber assembly 200, also referred to as irradiating at least a portion of the chamber assembly 200 with the ion beam IB, such that the ion beam IB is directed on a material held within the portion of the chamber assembly 200. The ion beam IB direct on the material held within the portion of the chamber assembly 200 may etch at least a portion of the material. Thus, in some example embodiments, an ion beam apparatus 500 may be configured to execute ion beam etching with regard to a material held within the chamber assembly 200, including executing ion beam etching of at least a portion of the material.

The chamber assembly 200 may include a source chamber 202 configured to generate a plasma. In some example embodiments, the chamber assembly 200 is configured to generate an ion beam IB based on the generated plasma. The chamber assembly 200 may further include a process chamber 204. The chamber assembly 200 may be configured to perform a process using the ion beam IB generated from the plasma in the source chamber 202, including ion beam IB etching of a material held within the process chamber 204. The source chamber 202 and the process chamber 204 may be connected to each other. The chamber assembly 200 may include a grid 206 provided therein, and the grid 206 may be between the source chamber 202 and the process chamber 204. The grid 206 may be configured to control one or more aspects (e.g., "parameters") of the ion beam IB, such that the grid 206 causes the ion beam IB to be irradiated into the process chamber 204. A stage 208 on which a substrate 100 may be loaded may be included in the process chamber 204. Thus, the stage 208 may be configured to support a material, including substrate 100, in the process chamber 204. As shown in FIG. 1, the stage 208 may be configured to be tilted with regard to a bottom surface of the chamber assembly 200. Since the stage 208 may be disposed at a tilt angle θ1 with respect to the bottom surface of the chamber assembly 200, the ion beam IB may be irradiated onto the substrate 100 at an incident angle θ2 with respect to a top surface of the substrate 100, where the incident angle θ2 is a difference between 90 degrees and the tilt angle θ1. The incident angle θ2 may be defined as an angle between the ion beam IB and the top surface of the substrate 100. The incident angle θ2 of the ion beam IB may be determined by (e.g., may be based on) the tilt angle θ1 of the stage 208. The ion beam IB may be irradiated to the top surface of the substrate 100, also referred to as the ion beam IB being directed on the top surface of the substrate 100, to execute a process on the substrate 100, including an ion beam IB etching of at least a portion of the substrate 100. The process may be performed to form a semiconductor device on the substrate 100. For example, the process may be an etching process that etches a material, including a thin layer, formed on the substrate 100, by using the ion beam IB to etch the material.

The detector 300 may be configured to detect a signal that is generated from a material in the chamber assembly 200 during the process. Such a material may include a material formed on the substrate 100, the substrate itself, some combination thereof, or the like. In detail, the detector 300 may detect a signal generated from a material on the substrate 100 while the process is performed on the substrate 100 in the process chamber 204. The detector 300 may detect the signal by using, for example, optical emission spectroscopy (OES) or secondary ion mass spectroscopy (SIMS). The signal may be generated by the material based on an ion beam IB being directed on the material.

The computer system 400 may include a controller 402 (also referred to herein as a "processor") configured to control a parameter of the chamber assembly 200 by using the signal obtained from the detector 300, a library 404 (also referred to herein as a "memory") configured to store various data, an input/output (I/O) unit 406, and an interface unit 408. The controller 402 ("processor") may include a hardware processor such as central processing unit (CPU), a multi-processor, a distributed processing system, an application specific integrated circuit (ASIC), and/or a suitable hardware processing unit, that when, executing instructions stored in the library 404 ("memory"), configures the controller 402 as a special purpose computer to perform the operations of one or more portions of the ion beam apparatus 500. The library 404 may include a hard disk and/or a non-volatile semiconductor memory device (e.g., a flash memory device, a phase-change memory device, and/or a magnetic memory device). The controller 402 may be configured to execute data stored at the library 404 to perform one or more operations. Functions of the controller 402 and the library 404 will be described later. The I/O unit 406 may include at least one of a keyboard, a keypad, or a display device. Signal data obtained from the detector 300 may be transmitted to the computer system 400 through the interface unit 408. The interface unit 408 may include at least one of a cable element, a wireless element, or a universal serial bus (USB). The controller 402, the library 404, the I/O unit 406, and the interface unit 408 may be coupled to each other through a data bus.

During the process performed in the process chamber 204, the controller 402 may control, adjust, change, etc. at least one parameter associated with the chamber assembly 200 to continuously adjust, change, etc. at least one of an ion energy associated with the ion beam IB, an ion current associated with the ion beam IB, and an incident angle θ2 of the ion beam IB with respect to a top surface of the material with time. The at least one parameter, as described herein, may be referred to herein as an ion beam apparatus parameter "IBAP." Continuously adjusting, changing, etc. an element (e.g., at least one of an ion energy associated with the ion beam IB, an ion current associated with the ion beam IB, and an incident angle θ2 of the ion beam IB with respect to a top surface of the material) "with time" may be understood herein to include continuously adjusting, changing, etc. the element over a period of elapsed time.

The parameter ("IBAP") may include at least one of, but is not limited to, a magnitude of source power applied to the source chamber 202 (e.g., a magnitude of electrical power supplied to the source chamber 202 to generate a plasma), a type of source gas and/or a flow rate of a source gas provided ("directed," "supplied," etc.) into the source chamber 202, a magnitude and/or polarity of a grid voltage applied to the grid 206, a magnitude and/or direction of a grid current flowing through the grid 206, the tilt angle θ1 of the stage 208, some combination thereof, or the like. In some example embodiments, the controller 402 may control the grid voltage magnitude and/or polarity and/or the type of the source gas to be changed continuously with time by using the signal obtained ("received") from the detector 300, and thus the ion energy of the ion beam IB may be changed continuously with time. In some example embodiments, the controller 402 may control the grid current (e.g., magnitude and/or polarity), the source power (e.g., magnitude), and the flow rate of the source gas (e.g., mass flow rate, flow velocity, volumetric flow rate, some combination thereof, etc.) to be changed continuously with time by using the signal obtained ("received") from the detector 300, and thus the ion current magnitude and/or direction of the ion beam IB may be changed continuously with time. In some example embodiments, the controller 402 may control the tilt angle θ1 of the stage 208 to be changed continuously with time by using the signal obtained (e.g., "received") from the detector 300, and thus the incident angle θ2 of the ion beam IB may be changed continuously with time.

Hereinafter, the method for controlling the parameter of the chamber assembly 200 (e.g., "IBAP") by the controller 402 will be described in more detail with reference to FIGS. 2 to 5.

Referring to FIGS. 1 and 2 to 5, the detector 300 may detect an intensity I of the signal generated from the material on the substrate 100 while the process is performed on the substrate 100. In some example embodiments, during the process, the controller 402 may determine a specific point in time T, also referred to simply as a "specific time T," at which the intensity I of the signal obtained from the detector 300 reaches a particular (or, alternatively, predetermined) value Ipd. Such a particular value may be referred to as a "threshold" intensity value. In other words, the specific time T may be a point in time determined according to an end point detection (EPD) method. In some example embodiments, an arbitrary time in the process may be determined as the specific time T by the controller 402.

As shown in at least FIGS. 2-5, a set-point of a parameter (e.g., an IBAP) may be continuously controlled (e.g., changed, adjusted, etc.) over time according to different control functions in different periods of time, based on whether the specific time T has been determined to occur (e.g., based on whether the signal intensity I has been determined to have reached and/or at least met the threshold intensity value Ipd). For example, the controller 402 may control the set-point of a parameter according to a first control function from the start of the process (e.g., a point in time at which an ion beam is activated, generated, initialized, etc. in the chamber assembly 200) to the specific time T (i.e., during a first section S1, also referred to as a first time period S1). Based on a determination that the specific time T has been reached (e.g., based on a determination that the signal intensity I has reached and/or has at least met the threshold intensity value Ipd), the controller 402 may selectively switch to controlling the set-point of the parameter according to a second, different control function from the specific time T to the end of the process (i.e., during a second section S2, also referred to as a second time period S2).

Figure 2:
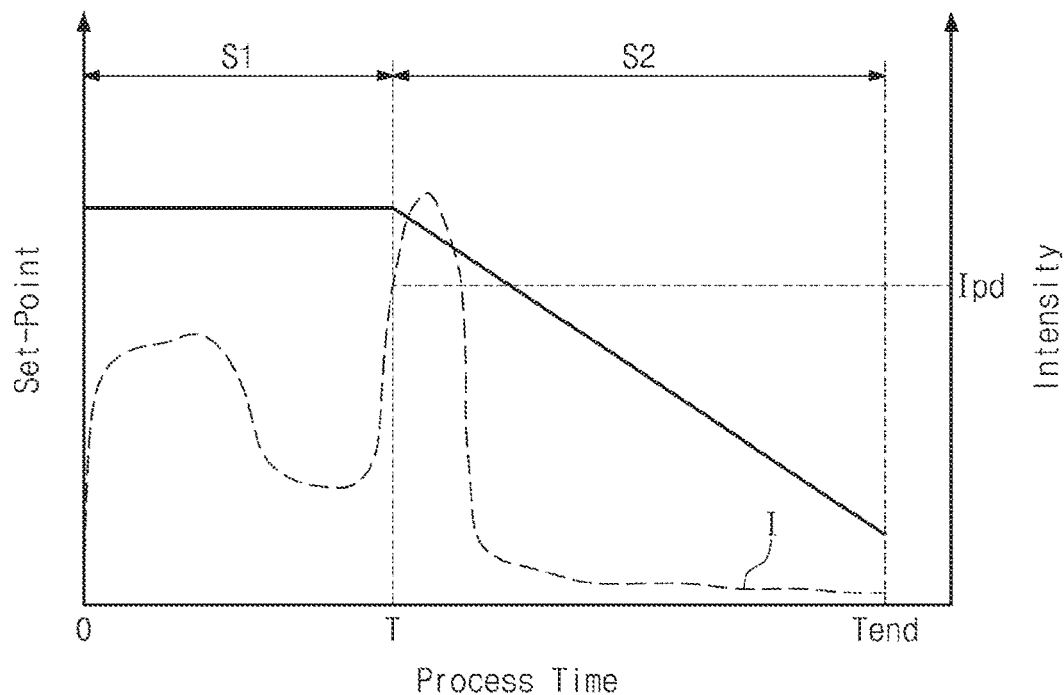
FIG. 2, FIG. 3, FIG. 4, and FIG. 5 are graphs illustrating a method for controlling a parameter of a chamber assembly by a controller of FIG. 1 according to some example embodiments of the inventive concepts.

In some example embodiments, as illustrated in FIG. 2, the set-point of the parameter (e.g., the IBAP) may be fixed from the start of the process (e.g., a point in time at which an ion beam is activated, generated, initialized, etc. in the chamber assembly 200) to the specific time T (i.e., during a first section S1, also referred to as a first time period S1) by the controller 402 and may be changed continuously with time from the specific time T to the end of the process (i.e., during a second section S2, also referred to as a second time period S2) by the controller 402. The end of the process may include a point in time at which the ion beam IB is deactivated, ceases to be generated, etc. in the chamber assembly 200. Restated, the set-point of the parameter may be controlled according to a first control function that fixes the set-point value at a fixed value over time during the first section S1. In addition, the set-point of the parameter may be controlled (e.g., changed, adjusted, etc.) according to a second control function that changes the set-point value based on elapsed time during the second section S2. In some example embodiments, the first control function and/or the second control function may be a function that expresses a value of the set-point of a parameter (e.g., an IBAP) as a function of elapsed time from a particular point in time, where the point in time may be one or more particular points in time, including the point in time at which the process starts, the specific time T, or the like. One or more of the first control function and the second control function may be a user-defined function. For example, the user-defined function may be a time-constant function, a linear function, an exponential function, and/or a logarithmic function. Elapsed time may be a variable of the user-defined function. In some example embodiments, the library 404 may store the user-defined function previously selected by a user, and the controller 402 may control the parameter (e.g., the IBAP) in such a way that the set-point of the parameter is changed continuously with time based on the user-defined function obtained from the library 404. In some example embodiments, the set-point of the parameter (e.g., the magnitude of the grid voltage) may be fixed during the first section S1 by the controller 402 according to the first control function (which is a time-constant function) and may be decreased continuously with time on the basis of the second control function (which is the user-defined function except for a time-constant function) during the second section S2 by the controller 402. In some example embodiments, if and/or when the parameter is the tilt angle θ1 of the stage 208, the tilt angle θ1 may be fixed during the first section S1 by the controller 402 according to the first control function (which is a time-constant function that expresses the tile angle θ1 as a fixed value over elapsed time) and may be increased continuously with time on the basis of the second control function (which is the user-defined function except for a time-constant function) during the second section S2 by the controller 402.

Figure 3:
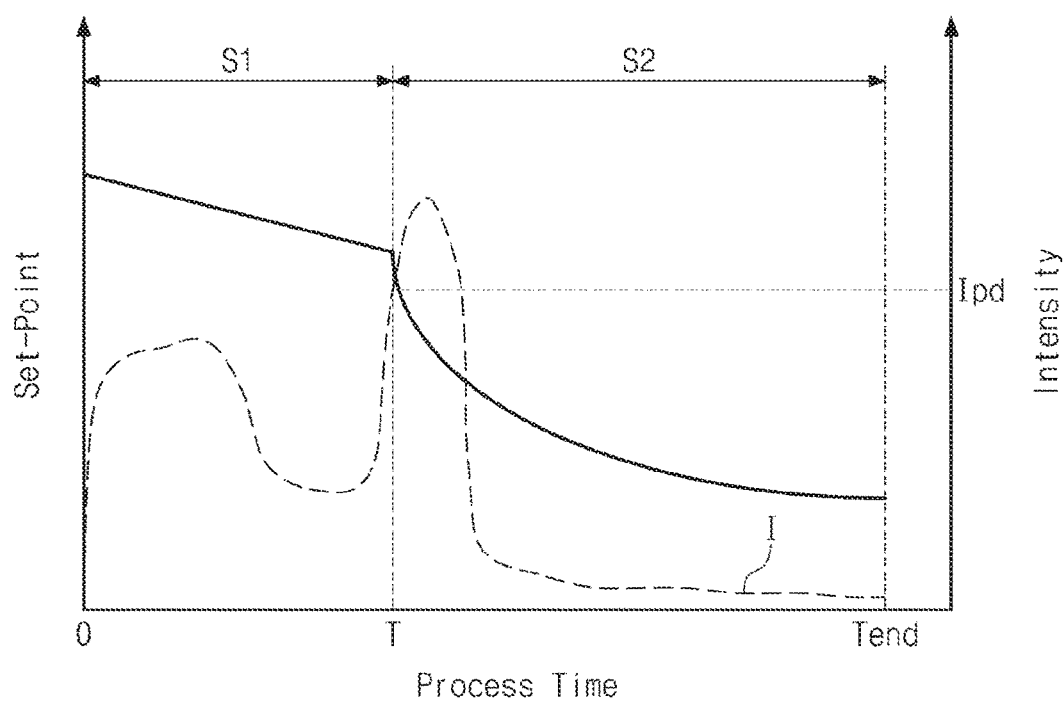

In some example embodiments, as illustrated in FIG. 3, the set-point of the parameter may be changed continuously with time on the basis of a first control function that is a first user-defined function from the start of the process to the specific time T (i.e., during the first section S1) by the controller 402, and may be changed continuously with time from the specific time T to the end of the process (i.e., during the second section S2) on the basis of a second control function that is a second user-defined function by the controller 402. For example, each of the first and second user-defined functions may be a linear function, an exponential function, or a logarithmic function where elapsed time is a variable of the first and second user-defined functions, respectively. The first and second user-defined functions may be different from each other as illustrated in FIG. 3. However, example embodiments of the inventive concepts are not limited thereto. In some example embodiments, the set-point of the parameter (e.g., the magnitude of the grid voltage) may be decreased continuously with time on the basis of the first user-defined function during the first section S1 by the controller 402 and may be decreased continuously with time on the basis of the second user-defined function during the second section S2 by the controller 402. In some example embodiments, if and/or when the parameter is the tilt angle θ1 of the stage 208, the tilt angle θ1 may be increased continuously with time on the basis of the first user-defined function during the first section S1 by the controller 402 and may be increased continuously with time on the basis of the second user-defined function during the second section S2 by the controller 402, unlike FIG. 3.

Figure 4:
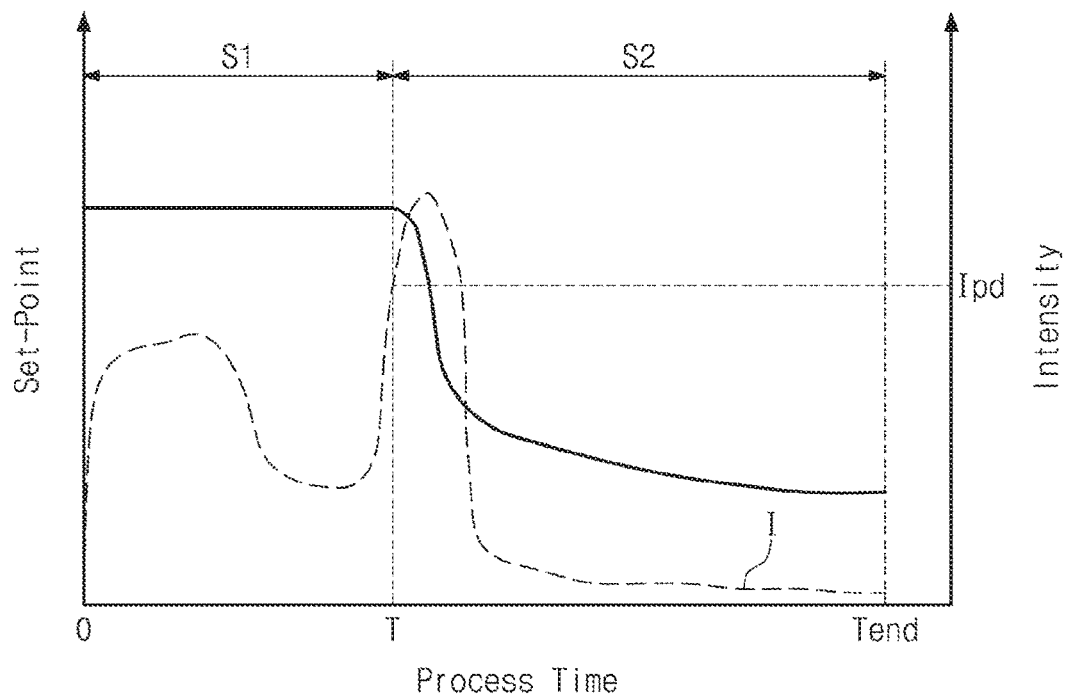

In some example embodiments, one or more of the first control function and the second control function may express a value of a set-point of a parameter (e.g., an IBAP) as a function of at least a signal intensity I. In some example embodiments, as illustrated in FIG. 4, the set-point of the parameter may be fixed from the start of the process to the specific time T (i.e., during the first section S1) by the controller 402, and may be changed continuously with time from the specific time T to the end of the process (i.e., during the second section S2) by the controller 402. The set-point of the parameter may be changed continuously with time based at least in part upon the intensity I of the signal obtained from the detector 300, based on a control function that expresses the set-point value based at least in part upon the signal intensity I. In some example embodiments, the set-point of the parameter (e.g., the grid voltage) may be fixed during the first section S1 by the controller 402 and may be decreased continuously with time based at least in part upon the intensity I of the signal during the second section S2 by the controller 402. In some example embodiments, the controller 402 may decrease the value of the set-point of the parameter (e.g., the magnitude of the grid voltage) during the second section S2. In addition, the controller 402 may increase (or decrease) a gradient of a variation in the set-point of the parameter (e.g., a rate of change of the magnitude of the grid voltage) during the second section S2 over time as the intensity I of the signal increases (or decreases). In some example embodiments, when the parameter is the tilt angle θ1 of the stage 208, the tilt angle θ1 may be fixed during the first section S1 by the controller 402 and may be increased continuously with time based at least in part upon the intensity I of the signal during the second section S2 by the controller 402, unlike FIG. 4. In some example embodiments, the controller 402 may increase the tilt angle θ1 during the second section S2 and may increase (or decrease) a gradient of a variation in the tilt angle θ1 during the second section S2 as the intensity I of the signal increases (or decreases).

Figure 5:
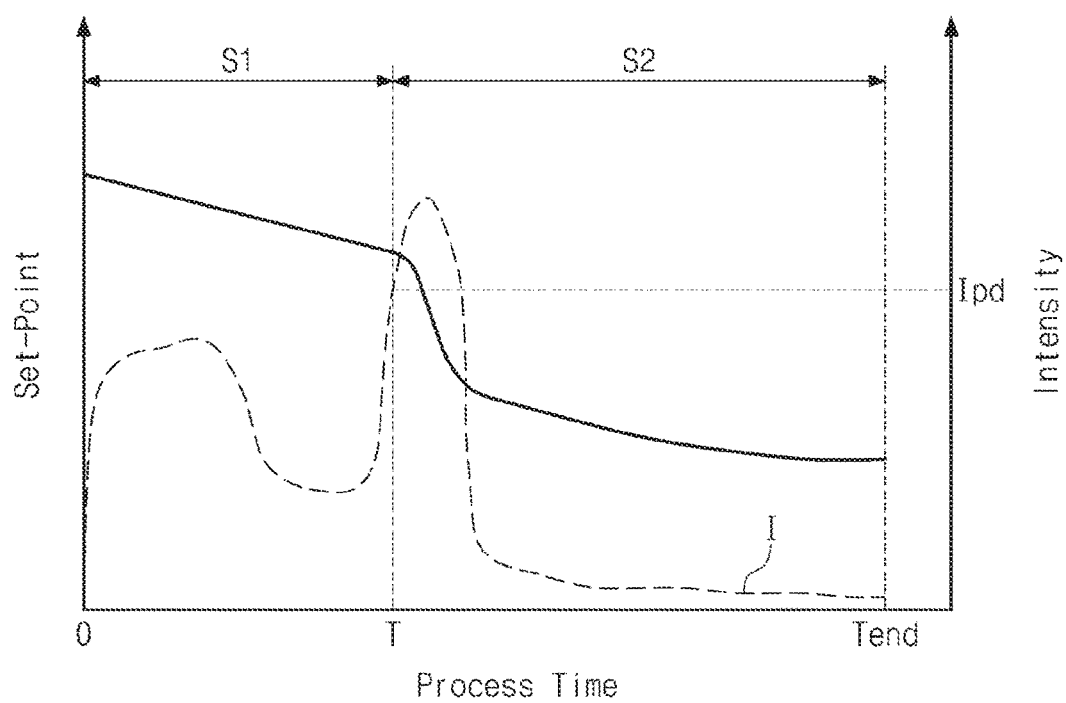

In some example embodiments, as illustrated in FIG. 5, the set-point of the parameter may be changed continuously with time from the start of the process to the specific time T (i.e., during the first section S1) on the basis of a user-defined function by the controller 402, and may be changed continuously with time from the specific time T to the end of the process (i.e., during the second section S2) in dependence on (e.g., based at least in part upon) the intensity I of the signal, obtained from the detector 300, by the controller 402. For example, the user-defined function may be a linear function, an exponential function, or a logarithmic function. In some example embodiments, the set-point of the parameter (e.g., the magnitude of the grid voltage) may be decreased continuously with time on the basis of the user-defined function during the first section S1 by the controller 402 and may be decreased continuously with time in dependence on the intensity I of the signal by the controller 402. In some example embodiments, the controller 402 may decrease the set-point of the parameter (e.g., the grid voltage) during the second section S2. In addition, the controller 402 may increase (or decrease) a gradient of a variation in the set-point of the parameter (e.g., the grid voltage) during the second section S2 as the intensity I of the signal increases (or decreases). In some example embodiments, when the parameter is the tilt angle θ1 of the stage 208, the tilt angle θ1 may be increased continuously with time on the basis of the user-defined function during the first section S1 by the controller 402 and may be increased continuously with time on the basis of the intensity I of the signal during the second section S2 by the controller 402, unlike FIG. 5. In some example embodiments, the controller 402 may increase the tilt angle θ1 during the second section S2 and may increase (or decrease) a gradient of a variation in the tilt angle θ1 during the second section S2 as the intensity I of the signal increases (or decreases).

In some example embodiments, the set-point of a parameter may be controlled based on a control function that expresses a value of the set-point as a function of both elapsed time and signal intensity I.

Figure 6:
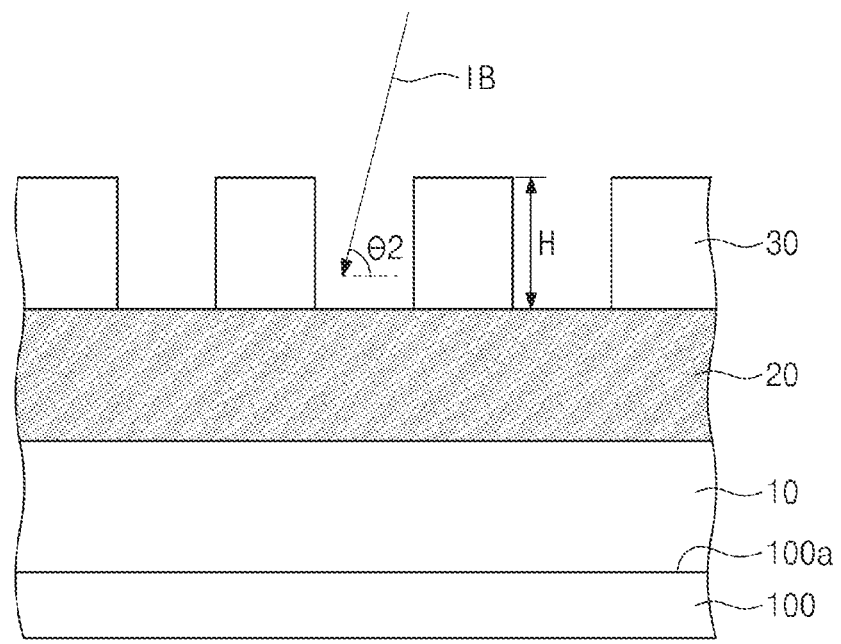
FIG. 6, FIG. 7, and FIG. 8 are cross-sectional views illustrating a method for forming patterns using the ion beam apparatus of FIG. 1 according to some example embodiments of the inventive concepts.
Figure 7:
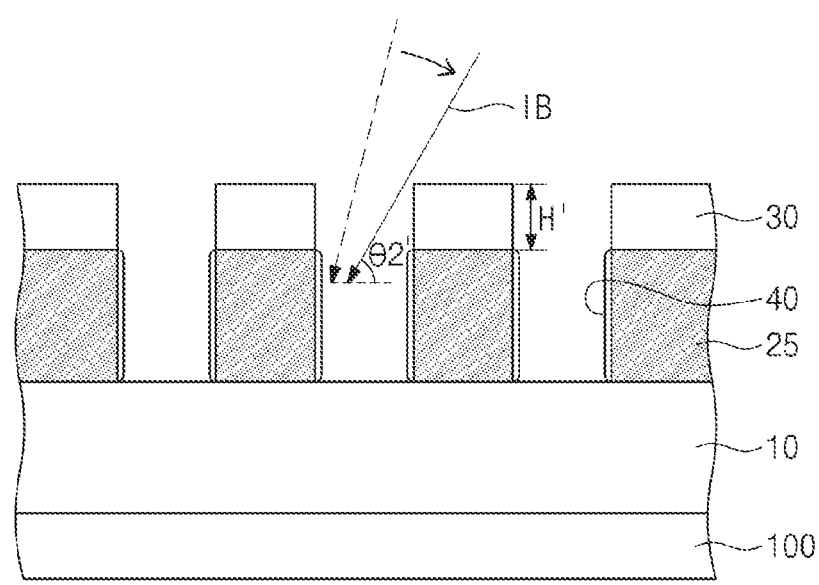
Figure 8:
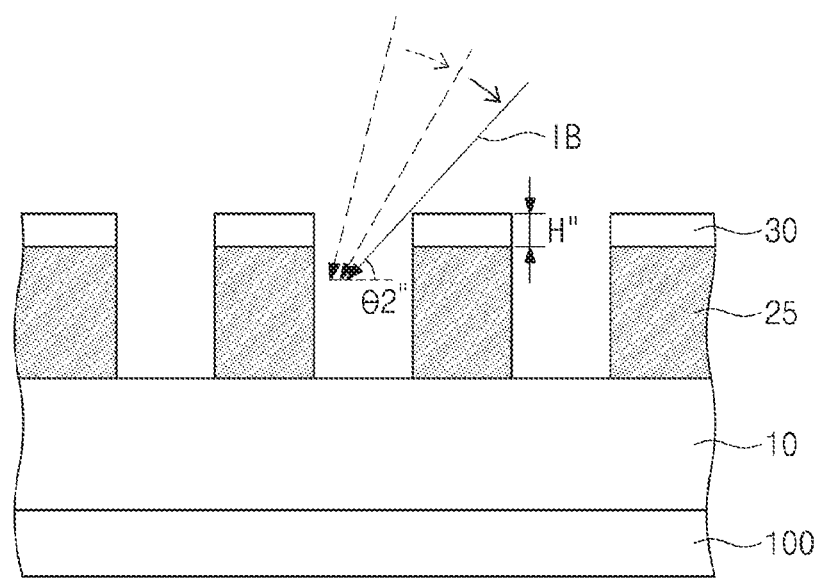
Figure 9:
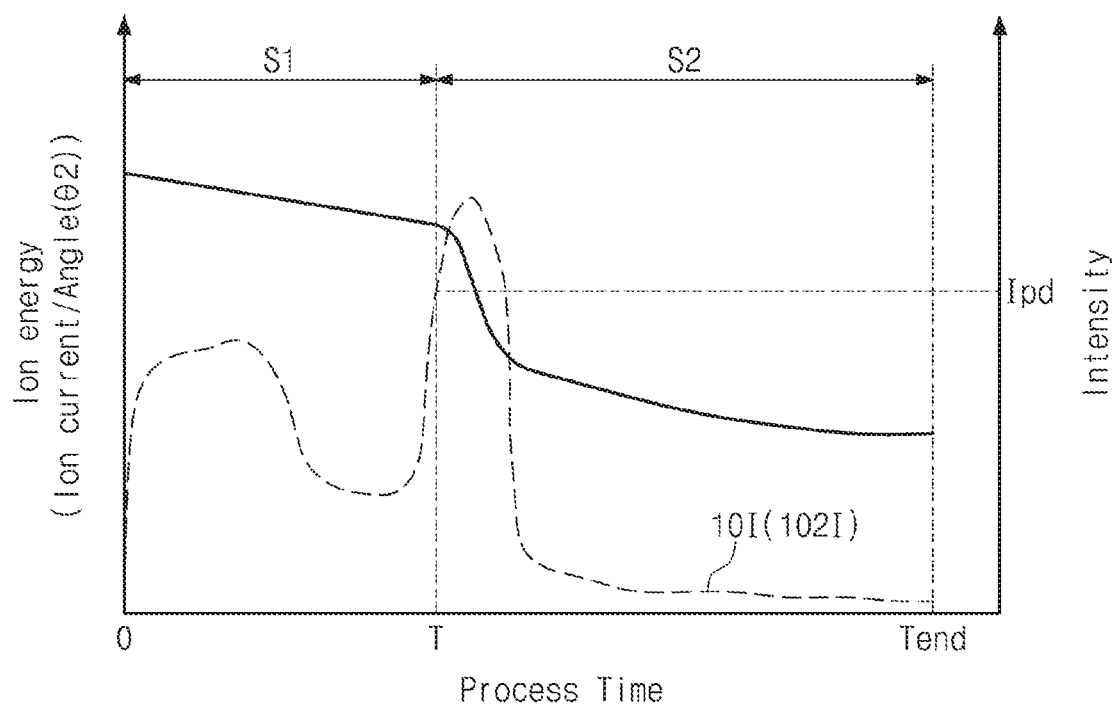
FIG. 9 is a graph illustrating a method for forming patterns using the ion beam apparatus of FIG. 1 according to some example embodiments of the inventive concepts.

FIG. 6, FIG. 7, and FIG. 8 are cross-sectional views illustrating a method for forming patterns using the ion beam apparatus of FIG. 1, e.g., based on executing an ion beam IB etching process on a material, according to some example embodiments of the inventive concepts. FIG. 9 is a graph illustrating a method for forming patterns using the ion beam apparatus of FIG. 1 according to some example embodiments of the inventive concepts.

Referring to FIGS. 1 and 6, a lower layer 10 and an etch target layer 20 may be sequentially formed on a substrate 100. The lower layer 10 may be formed between the substrate 100 and the etch target layer 20. Mask patterns 30 may be formed on the etch target layer 20. The mask patterns 30 may be formed to have a particular (or, alternatively, predetermined) height H. The substrate 100 on which the lower layer 10, the etch target layer 20, and the mask patterns 30 are formed may be loaded onto the stage 208 in the process chamber 204 of the ion beam apparatus 500 of FIG. 1. Thereafter, an etching process using the ion beam IB (e.g., an ion beam IB etching process) may be performed, executed, implemented, etc. on the substrate 100. During the etching process, the mask patterns 30 may be used as etch masks and the etch target layer 20 may be etched by the ion beam IB irradiated to a surface of the etch target layer 20 (also referred to as an ion beam IB directed on the surface of the etch target layer 20, an ion beam IB directed to the substrate 100, etc.) between the mask patterns 30. The ion beam IB may be irradiated at an incident angle θ2 with respect to a top surface 100a of the substrate 100.

Referring to FIGS. 7 and 9, the etch target layer 20 may be etched to form patterns 25 laterally spaced apart from each other on the lower layer 10. Since the patterns 25 are formed, the lower layer 10 between the patterns 25 may be exposed.

During the etching process, the detector 300 of FIG. 1 may detect an intensity 10I of a signal generated from a material of the lower layer 10. In some example embodiments, during the etching process, the controller 402 of FIG. 1 may determine a specific time T at which the intensity 10I of the signal obtained from the detector 300 reaches a particular (or, alternatively, predetermined) value Ipd (e.g., a threshold intensity value). In other words, the specific time T may be a point in time determined according to an end point detection (EPD) method. In some example embodiments, the specific time T may be a point in time at which the lower layer 10 between the patterns 25 is exposed by the ion beam IB during the etching of the etch target layer 20 by the ion beam IB. In some example embodiments, an arbitrary point in time in the etching process may be determined as the specific time T by the controller 402.

In some example embodiments, at least one of the ion energy, the ion current, and the incident angle θ2 of the ion beam IB may be decreased continuously with time on the basis of a control function, including a user-defined function (e.g., a linear function) from the start of the etching process to the specific time T (i.e., during a first section S1). In more detail, during the etching process, the controller 402 of FIG. 1 may control one or more parameters associated with the chamber assembly 200 (e.g., adjust a value of the one or more parameters to match the value of a set-point of the one or more parameters) based on a control function in such a way that at least one of the ion energy, the ion current, and the incident angle θ2 of the ion beam IB is changed continuously with time based on the control function. The controller 402 may control a parameter associated with the chamber assembly 200 according to at least one of the methods, control functions, etc. described with reference to FIGS. 2 to 5. As referred to herein a set-point of a parameter may be interchangeably referred to as a set-point value, magnitude, etc. of the parameter. In some example embodiments, a set-point of the parameter (e.g., the magnitude of the grid voltage) may be decreased continuously with time on the basis of the user-defined function during the first section S1 by the controller 402 as described with reference to FIGS. 3 and 5, and thus the ion energy of the ion beam IB may be decreased continuously with time on the basis of the user-defined function during the first section S1. In some example embodiments, the set-point of the parameter (e.g., the magnitude of the tilt angle θ1 of the stage 208 of FIG. 1) may be increased continuously with time on the basis of the user-defined function during the first section S1 by the controller 402, and thus the magnitude of the incident angle θ2 of the ion beam IB may be decreased continuously with time on the basis of the user-defined function during the first section S1 (i.e., θ2>θ2').

Etch by-products 40 occurring by the etching process (e.g., etch by-products generated during the ion beam IB etching of at least the etch target layer 20) may be re-deposited on sidewalls of the patterns 25 during the etching.

Referring to FIGS. 8 and 9, the etching process may be performed until the etch by-products 40 re-deposited on the sidewalls of the patterns 25 are removed by the ion beam IB. Based on a determination that the etch by-products 40 are removed, the etching process may be ended by the controller 402 (e.g., the controller 402 may cause the ion beam IB to be deactivated).

In some example embodiments, at least one of the ion energy, the ion current, and the incident angle θ2 of the ion beam IB may be decreased from the specific time T to the end of the etching process (i.e., during a second section S2) based at least in part on the intensity 10I of the signal obtained ("received") from the detector 300. In some example embodiments, as described with reference to FIGS. 4 and 5, the controller 402 may decrease the set-point of the parameter (e.g., the magnitude of the grid voltage) during the second section S2 and may increase (or decrease) a gradient of a variation in the set-point of the parameter (e.g., the magnitude of the grid voltage) during the second section S2 as the intensity 10I of the signal increases (or decreases). Thus, the ion energy of the ion beam IB may be decreased over time in dependence on the intensity 10I of the signal during the second section S2. In some example embodiments, the controller 402 may increase the set-point of the parameter (e.g., the tilt angle θ1 of the stage 208 of FIG. 1) during the second section S2 and may increase (or decrease) a gradient of a variation in the set-point (e.g., a magnitude of an angle) during the second section S2 as the intensity 10I of the signal increases (or decreases). Thus, the magnitude of the incident angle θ2 of the ion beam IB may be decreased over time based at least in part upon the intensity 10I of the signal during the second section S2 (i.e., θ2'>θ2").

In some example embodiments, at least one of the ion energy, the ion current, and the incident angle θ2 of the ion beam IB may be decreased continuously with time from the specific time T to the end of the etching process (i.e., during the second section S2) on the basis of a user-defined function. In some example embodiments, the set-point of the parameter (e.g., the magnitude of the grid voltage) may be decreased continuously with time on the basis of the user-defined function during the second section S2 by the controller 402 as described with reference to FIGS. 2 and 3, and thus the ion energy of the ion beam IB may be decreased continuously with time on the basis of the user-defined function during the second section S2. In some example embodiments, the set-point of the parameter (e.g., the tilt angle θ1 of the stage 208 of FIG. 1) may be increased continuously with time on the basis of the user-defined function during the second section S2 by the controller 402, and thus the incident angle θ2 of the ion beam IB may be decreased continuously with time on the basis of the user-defined function during the second section S2 (i.e., θ2'>θ2").

Referring to FIGS. 1 and 8, after the etching process is finished (e.g., after the ion beam IB is deactivated), the substrate 100 may be unloaded from the stage 208 and may be transferred outside the ion beam apparatus 500.

Generally, the heights of the mask patterns 30 may be lowered during the etching process based on characteristics of the physical etching process using the ion beam IB (i.e., H>H'>H"). In some example embodiments, the amount of the ion beam IB irradiated onto the etch target layer 20 between the mask patterns 30 may be increased. Thus, when the ion beam IB has a fixed ion energy (or a fixed ion current or a fixed incident angle $\theta 2$), the top surface of the lower layer 10 between the patterns 25 may be recessed.

In the method for forming patterns according to some example embodiments of the inventive concepts, at least one of the ion energy, the ion current, and the incident angle $\theta 2$ of the ion beam IB may be controlled to be decreased continuously in magnitude with time during the etching process. Thus, even though the heights H of the mask patterns 30 are lowered during the etching process, it is possible to at least partially mitigate, inhibit, etc. the top surface of the lower layer 10 between the patterns 25 from being recessed based on the ion beam IB.

FIG. 10, FIG. 11, FIG. 12, and FIG. 13 are cross-sectional views illustrating a method for manufacturing a magnetic memory device (e.g., an MRAM) using the ion beam apparatus of FIG. 1 according to some example embodiments of the inventive concepts.

Figure 10:
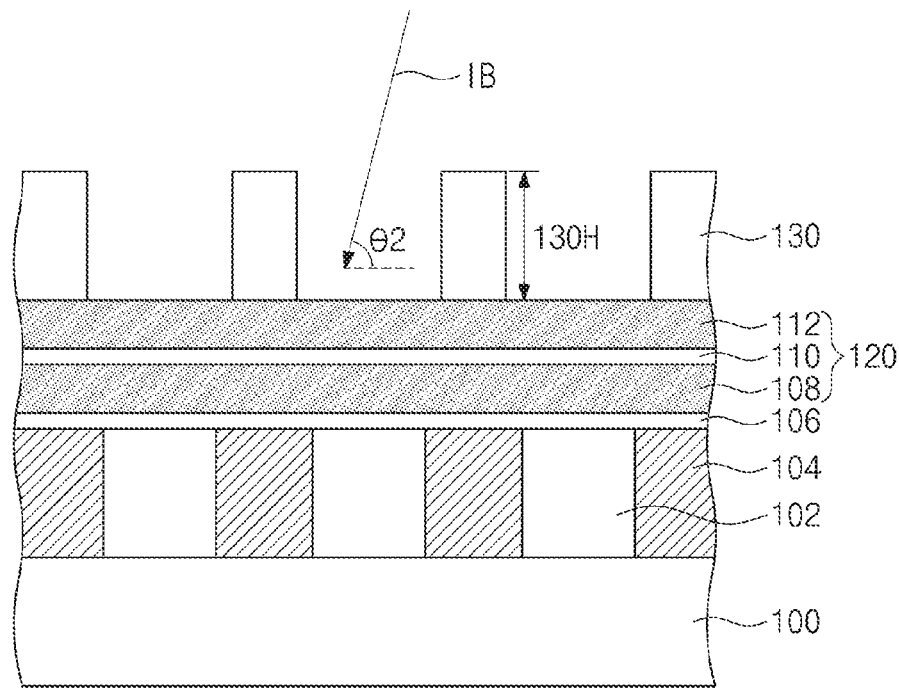
FIG. 10, FIG. 11, FIG. 12, and FIG. 13 are cross-sectional views illustrating a method for manufacturing a magnetic memory device using the ion beam apparatus of FIG. 1 according to some example embodiments of the inventive concepts.

Referring to FIG. 10, a lower interlayer insulating layer 102 may be formed on a substrate 100. The substrate 100 may include a semiconductor substrate. For example, the substrate 100 may include a silicon substrate, a germanium substrate, or a silicon-germanium substrate. In some example embodiments, selection elements (not shown) may be formed on the substrate 100, and the lower interlayer insulating layer 102 may be formed to cover the selection elements. The selection elements may be field effect transistors. Alternatively, the selection elements may be diodes. The lower interlayer insulating layer 102 may be formed of a single layer or multi-layer including at least one of an oxide layer (e.g., a silicon oxide layer), a nitride layer (e.g., a silicon nitride layer), or an oxynitride layer (e.g., a silicon oxynitride layer).

Lower contact plugs 104 may be formed in the lower interlayer insulating layer 102. Each of the lower contact plugs 104 may penetrate the lower interlayer insulating layer 102 so as to be electrically connected to one terminal of a corresponding one of the selection elements. The lower contact plugs 104 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

A bottom electrode layer 106 and a magnetic tunnel junction layer 120 may be sequentially formed on the lower interlayer insulating layer 102. The bottom electrode layer 106 may include a conductive metal nitride such as titanium nitride and/or tantalum nitride. In some example embodiments, the bottom electrode layer 106 may include a material (e.g., ruthenium (Ru)) capable of assisting crystal growth of magnetic layers constituting the magnetic tunnel junction layer 120. The bottom electrode layer 106 may be formed by a sputtering process, a chemical vapor deposition (CVD) process, or an atomic layer deposition (ALD) process. The magnetic tunnel junction layer 120 may include a first magnetic layer 108, a tunnel barrier layer 110 and a second magnetic layer 112 which are sequentially stacked on the bottom electrode layer 106. One of the first and second magnetic layers 108 and 112 may correspond to a reference layer having a magnetization direction fixed in one direction, and the other of the first and second magnetic layers 108 and 112 may correspond to a free layer having a magnetization direction changeable to be parallel or anti-parallel to the fixed magnetization direction of the reference layer.

In some example embodiments, the magnetization directions of the reference layer and the free layer may be substantially perpendicular to an interface between the tunnel barrier layer 110 and the second magnetic layer 112. In some example embodiments, each of the reference layer and the free layer may include at least one of a perpendicular magnetic material (e.g., CoFeTb, CoFeGd, or CoFeDy), a perpendicular magnetic material having a $L1_0$ lattice structure, a CoPt alloy having a hexagonal close packed (HCP) lattice structure, or a perpendicular magnetic structure. The perpendicular magnetic material having the $L1_0$ lattice structure may include at least one of FePt having the $L1_0$ lattice structure, FePd having the $L1_0$ lattice structure, CoPd having the $L1_0$ lattice structure, or CoPt having the $L1_0$ lattice structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number ("quantity") of bilayers. Here, the reference layer may be thicker than the free layer, and/or a coercive force of the reference layer may be greater than a coercive force of the free layer.

In some example embodiments, the magnetization directions of the reference layer and the free layer may be substantially parallel to the interface between the tunnel barrier layer 110 and the second magnetic layer 112. In some example embodiments, each of the reference layer and the free layer may include a ferromagnetic material. The reference layer may further include an anti-ferromagnetic material for fixing a magnetization direction of the ferromagnetic material included in the reference layer.

The tunnel barrier layer 110 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the first magnetic layer 108, the tunnel barrier layer 110 and the second magnetic layer 112 may be formed by a physical vapor deposition (PVD) process (e.g., a sputtering process) or a CVD process.

Conductive mask patterns 130 may be formed on the magnetic tunnel junction layer 120. The conductive mask patterns 130 may define regions in which pattern structures will be formed on the substrate 100. The conductive mask patterns 130 may be formed to have a particular (or, alternatively, predetermined) height 130H. For example, the conductive mask patterns 130 may include at least one of tungsten, titanium, tantalum, aluminum, or a metal nitride (e.g., titanium nitride or tantalum nitride).

Referring to FIGS. 1 and 10, the substrate 100 having the conductive mask patterns 130 may be loaded onto the stage 208 in the process chamber 204 of the ion beam apparatus 500 of FIG. 1. Thereafter, an etching process using the ion beam IB may be performed on the substrate 100. The conductive mask patterns 130 may be used as etch masks during the etching process, and the magnetic tunnel junction layer 120 and the bottom electrode layer 106 may be etched during the etching process by the ion beam IB irradiated ("directed") to a surface of the magnetic tunnel junction layer 120 between the conductive mask patterns 130. The ion beam IB may be irradiated at an incident angle $\theta 2$ with respect to a top surface of the substrate 100. The magnetic tunnel junction layer 120 and the bottom electrode layer 106 may be sequentially etched by the ion beam IB.

Figure 11:
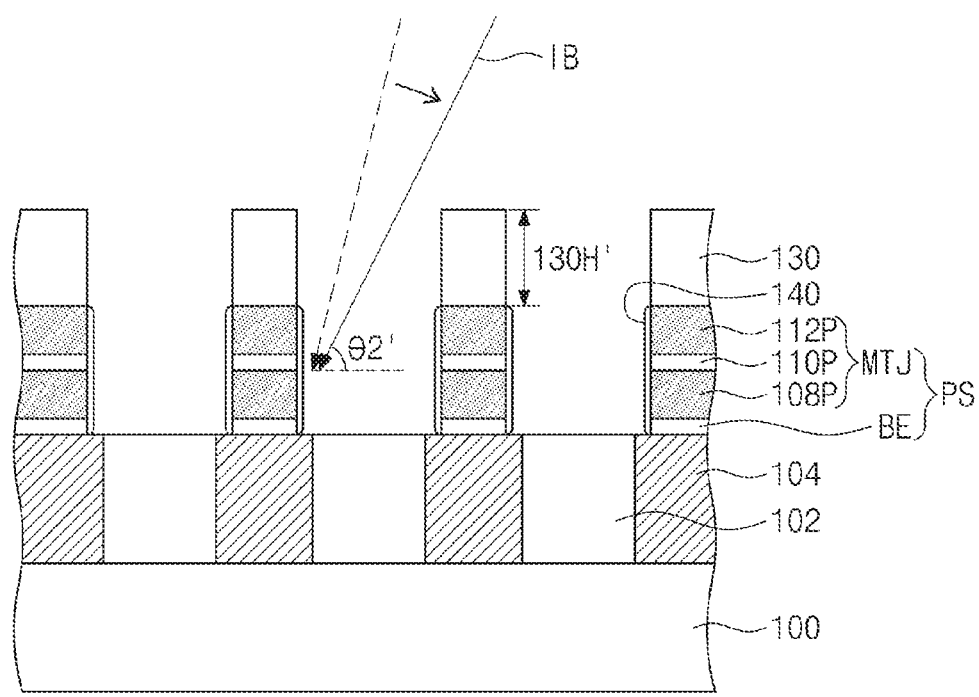

Referring to FIGS. 9 and 11, the magnetic tunnel junction layer 120 and the bottom electrode layer 106 may be etched to form pattern structures PS laterally spaced apart from each other on the lower interlayer insulating layer 102. Each of the pattern structures PS may include a magnetic tunnel junction pattern MTJ formed by etching the magnetic tunnel junction layer 120, and a bottom electrode BE formed by etching the bottom electrode layer 106. The magnetic tunnel junction pattern MTJ may include a first magnetic pattern 108P, a tunnel barrier pattern 110P and a second magnetic pattern 112P which are sequentially stacked on the bottom electrode BE. The first magnetic pattern 108P, the tunnel barrier pattern 110P, and the second magnetic pattern 112P may be formed by etching the first magnetic layer 108, the tunnel barrier layer 110, and the second magnetic layer 112, respectively. The first magnetic pattern 108P may be disposed between the bottom electrode BE and the tunnel barrier pattern 110P. The second magnetic pattern 112P may be spaced apart from the first magnetic pattern 108P with the tunnel barrier pattern 110P interposed therebetween. Each of the pattern structures PS may be electrically connected to a corresponding one of the lower contact plugs 104. The bottom electrode BE of each of the pattern structures PS may be disposed between the magnetic tunnel junction pattern MTJ and the corresponding lower contact plug 104. In some example embodiments, a bottom surface of the bottom electrode BE may be in contact with a top surface of the corresponding lower contact plug 104. Since the pattern structures PS are formed, the lower interlayer insulating layer 102 may be exposed between the pattern structures PS.

During the etching process, the detector 300 of FIG. 1 may detect an intensity I02I of a signal generated from a material of the lower interlayer insulating layer 102. In some example embodiments, during the etching process, the controller 402 of FIG. 1 may determine a specific time T at which the intensity I02I of the signal obtained from the detector 300 reaches a particular (or, alternatively, predetermined) value Ipd. In other words, the specific time T may be a time determined according to an end point detection (EPD) method. In some example embodiments, the specific time T may be a time when the lower interlayer insulating layer 102 between the pattern structures PS is exposed in the etching process. In some example embodiments, an arbitrary time in the etching process may be determined as the specific time T by the controller 402.

In some example embodiments, at least one of an ion energy, an ion current, and an incident angle $\theta 2$ of the ion beam IB may be decreased continuously with time on the basis of a user-defined function from the start of the etching process to the specific time T (i.e., during a first section S1). In more detail, during the etching process, the controller 402 of FIG. 1 may control the parameter of the chamber assembly 200 in such a way that at least one of the ion energy, the ion current, and the incident angle $\theta 2$ of the ion beam IB is changed continuously with time. The controller 402 may control the parameter of the chamber assembly 200 by at least one of the methods described with reference to FIGS. 2 to 5. In some example embodiments, a set-point of the parameter (e.g., the magnitude of the grid voltage) may be decreased continuously with time on the basis of the user-defined function during the first section S1 by the controller 402 as described with reference to FIGS. 3 and 5, and thus the ion energy of the ion beam IB may be decreased continuously with time on the basis of the user-defined function during the first section S1. In some example embodiments, the set-point of the parameter (e.g., the tilt angle $\theta 1$ of the stage 208 of FIG. 1) may be increased continuously with time on the basis of the user-defined function during the first section S1 by the controller 402, and thus the incident angle $\theta 2$ of the ion beam IB may be decreased continuously with time on the basis of the user-defined function during the first section S1 (i.e., $\theta 2 > \theta 2'$).

Conductive etch by-products 140 occurring by the etching process may be re-deposited on sidewalls of the pattern structures PS during the etching process.

Figure 12:
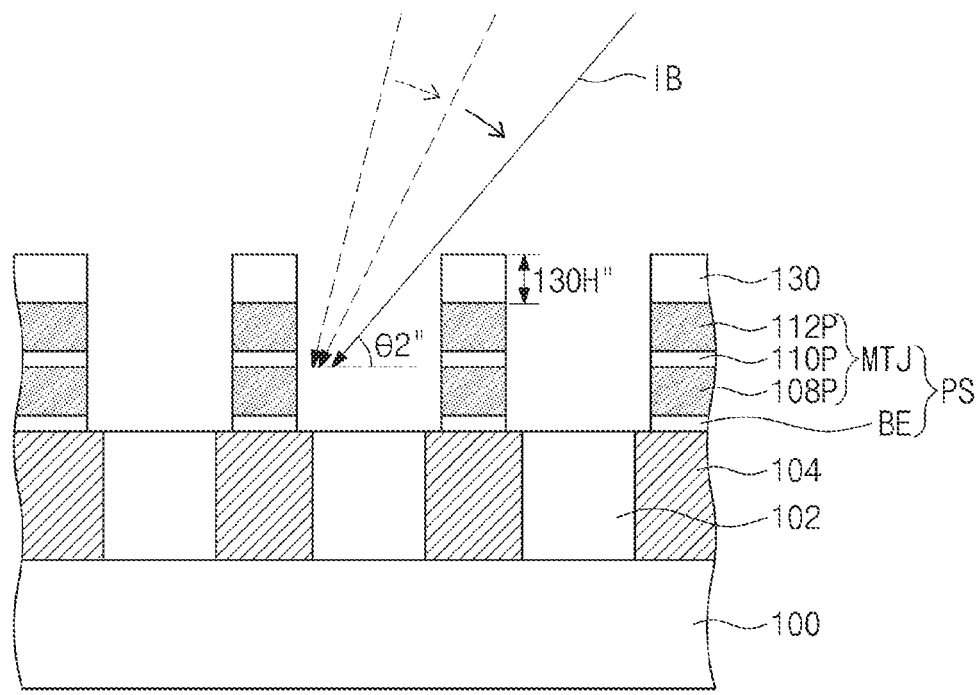

Referring to FIGS. 9 and 12, if and/or when the conductive etch by-products 140 remain on the sidewalls of the pattern structures PS, an electrical short may be caused between the magnetic patterns 108P and 112P in the magnetic tunnel junction pattern MTJ of each of the pattern structures PS. Thus, the etching process for forming the pattern structures PS may be performed until the conductive etch by-products 140 are removed from the sidewalls of the pattern structures PS.

In some example embodiments, at least one of the ion energy, the ion current, and the incident angle $\theta 2$ of the ion beam IB may be decreased from the specific time T to the end of the etching process (i.e., during a second section S2) based at least in part on the intensity I02I of the signal obtained from the detector 300. In some example embodiments, as described with reference to FIGS. 4 and 5, the controller 402 may decrease the set-point of the parameter (e.g., the magnitude of the grid voltage) during the second section S2 and may increase (or decrease) a gradient of a variation in the set-point of the parameter (e.g., the magnitude of the grid voltage) during the second section S2 as the intensity I02I of the signal increases (or decreases). Thus, the ion energy of the ion beam IB may be decreased over time in dependence on the intensity I02I of the signal during the second section S2. In some example embodiments, the controller 402 may increase the set-point of the parameter (e.g., the tilt angle $\theta 1$ of the stage 208 of FIG. 1) during the second section S2 and may increase (or decrease) a gradient of a variation in the set-point (e.g., an angle) during the second section S2 as the intensity I02I of the signal increases (or decreases). Thus, the incident angle $\theta 2$ of the ion beam IB may be decreased over time in dependence on the intensity I02I of the signal during the second section S2 (i.e., $\theta 2' > \theta 2''$).

In some example embodiments, at least one of the ion energy, the ion current, and the incident angle $\theta 2$ of the ion beam IB may be decreased continuously with time from the specific time T to the end of the etching process (i.e., during the second section S2) on the basis of a user-defined function. In some example embodiments, the set-point of the parameter (e.g., the magnitude of the grid voltage) may be decreased continuously with time on the basis of the user-defined function during the second section S2 by the controller 402 as described with reference to FIGS. 2 and 3, and thus the ion energy of the ion beam IB may be decreased continuously with time on the basis of the user-defined function during the second section S2. In some example embodiments, the set-point of the parameter (e.g., the tilt angle $\theta 1$ of the stage 208 of FIG. 1) may be increased continuously with time on the basis of the user-defined function during the second section S2 by the controller 402, and thus the incident angle $\theta 2$ of the ion beam IB may be decreased continuously with time on the basis of the user-defined function during the second section S2 (i.e., $\theta 2' > \theta 2''$).

Referring to FIGS. 1 and 12, after the etching process is finished, the substrate 100 may be unloaded from the stage 208 and may be transferred outside the ion beam apparatus 500. Thereafter, a subsequent process may be performed on the substrate 100.

Generally, the heights of the conductive mask patterns 130 may be lowered during the etching process by characteristics of the physical etching process using the ion beam IB (i.e., 130H>130H'>130H"). In some example embodiments, the amount of the ion beam IB irradiated onto the magnetic tunnel junction layer 120 between the conductive mask patterns 130 may be increased. Thus, when the ion beam IB has a fixed ion energy (or a fixed ion current or a fixed incident angle θ2), the top surface of the lower interlayer insulating layer 102 between the pattern structures PS may be recessed. In some example embodiments, an increase in thickness of the lower interlayer insulating layer 102 may be required in consideration of a process margin. Thus, an aspect ratio of the lower contact plugs 104 formed in the lower interlayer insulating layer 102 may be increased. As a result, formation of the lower contact plugs 104 may be difficult.

In addition, when the ion energy, the ion current, and/or incident angle θ2 of the ion beam IB are changed during the etching process, an additional stable time for stabilizing these items may be required. In some example embodiments, defects may occur on the substrate 100 by particles generated during the stable time.

In the method for forming a magnetic memory device according to some example embodiments of the inventive concepts, at least one of the ion energy, the ion current, and the incident angle θ2 of the ion beam IB may be controlled to be decreased continuously with time during the etching process for forming the pattern structures PS. Thus, even though the heights 130H of the conductive mask patterns 130 are lowered during the etching process, it is possible to inhibit the top surface of the lower interlayer insulating layer 102 between the pattern structures PS from being recessed. Thus, an increase in thickness of the lower interlayer insulating layer 102 may not be required, and the lower contact plugs 104 may be easily formed in the lower interlayer insulating layer 102.

In addition, since at least one of the ion energy, the ion current, and the incident angle θ2 of the ion beam IB is controlled to be changed continuously with time, an additional stable time for stabilizing the ion energy, the ion current, and/or the incident angle θ2 may not be required in the etching process. Thus, it is possible to prevent defects from occurring by particles generated during the stable time.

Figure 13:
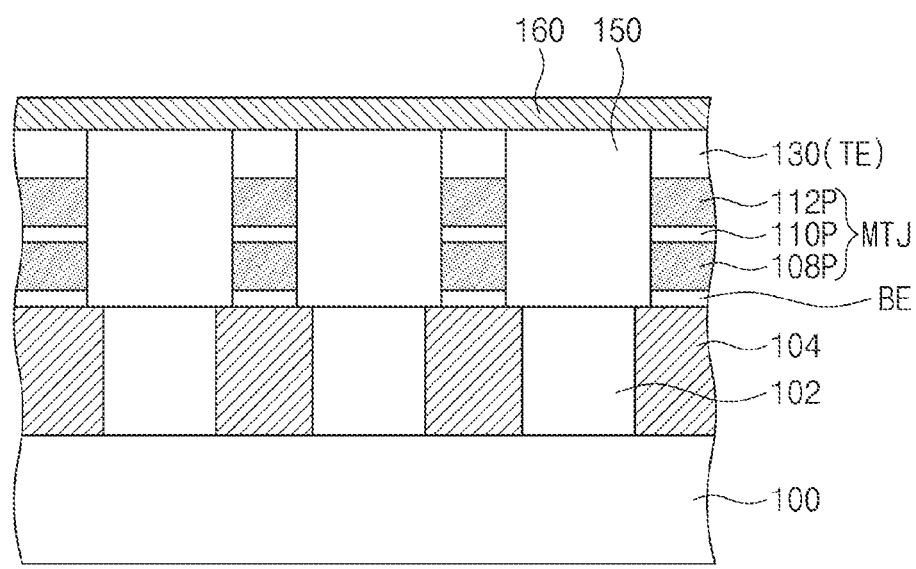

Referring to FIG. 13, an upper interlayer insulating layer 150 may be formed on the substrate 100 in the subsequent process. The upper interlayer insulating layer 150 may cover the bottom electrodes BE, the magnetic tunnel junction patterns MTJ, and the conductive mask patterns 130, which are formed on the lower interlayer insulating layer 102. The conductive mask patterns 130 may function as top electrodes TE. The upper interlayer insulating layer 150 may include at least one of an oxide layer (e.g., a silicon oxide layer), a nitride layer (e.g., a silicon nitride layer), or an oxynitride layer (e.g., silicon oxynitride layer). An interconnection line 160 may be formed on the upper interlayer insulating layer 150. The interconnection line 160 may extend in one direction and may be electrically connected to a plurality of the magnetic tunnel junction patterns MTJ arranged in the one direction. Each of the magnetic tunnel junction patterns MTJ may be electrically connected to the interconnection line 160 through a corresponding one of the top electrodes TE. In some embodiments, the interconnection line 160 may function as a bit line.

Figure 14:
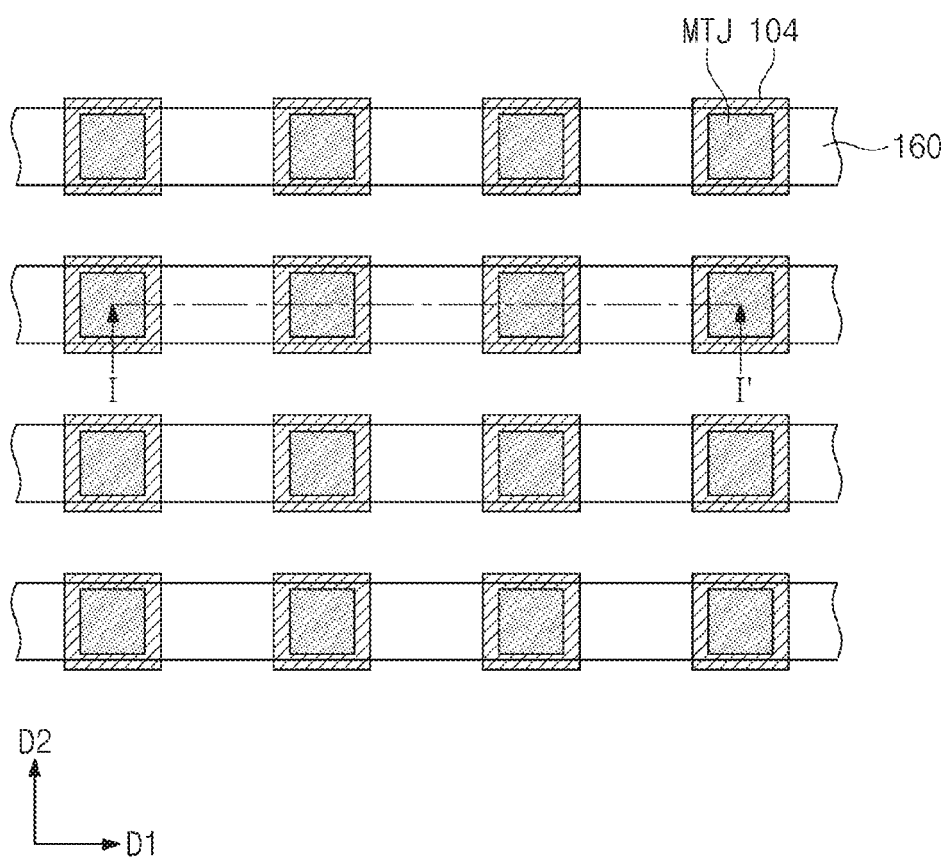
FIG. 14 is a plan view illustrating a magnetic memory device manufactured according to some example embodiments of the inventive concepts.
Figure 15:
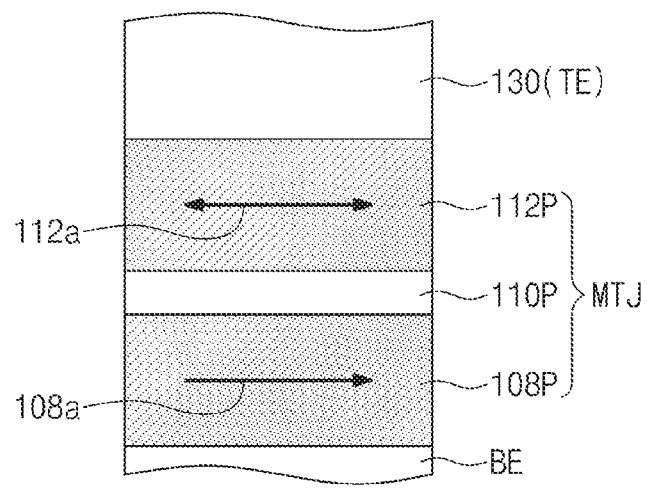
FIG. 15 is a view illustrating an example of a magnetic tunnel junction pattern of FIG. 13 according to some example embodiments of the inventive concepts.
Figure 16:
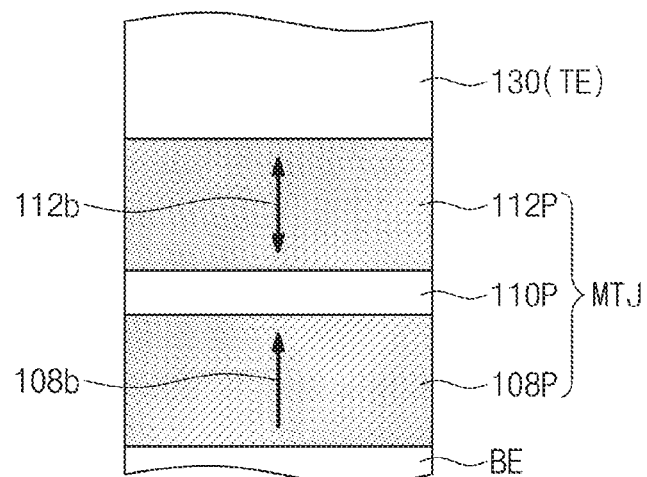
FIG. 16 is a view illustrating an example of a magnetic tunnel junction pattern of FIG. 13 according to some example embodiments of the inventive concepts.

FIG. 14 is a plan view illustrating a magnetic memory device manufactured according to some example embodiments of the inventive concepts. FIG. 15 is a view illustrating an example of a magnetic tunnel junction pattern of FIG. 13, and FIG. 16 is a view illustrating an example of a magnetic tunnel junction pattern of FIG. 13. Hereinafter, structural characteristics of the magnetic memory device manufactured according to some example embodiments of the inventive concepts will be described with reference to FIGS. 13 to 16. FIG. 13 is a cross-sectional view taken along a line I-I' of FIG. 14.

Referring to FIGS. 13 and 14, the lower interlayer insulating layer 102 may be provided on the substrate 100. Selection elements (not shown) may be provided on the substrate 100, and the lower interlayer insulating layer 102 may cover the selection elements. The selection elements may be field effect transistors or diodes. Lower contact plugs 104 may be provided in the lower interlayer insulating layer 102. Each of the lower contact plugs 104 may penetrate the lower interlayer insulating layer 102 so as to be electrically connected to one terminal of a corresponding one of the selection elements. In some example embodiments, top surfaces of the lower contact plugs 104 may be substantially coplanar with a top surface of the lower interlayer insulating layer 102. The top surface of the lower interlayer insulating layer 102 between the lower contact plugs 104 may be disposed at the substantially same height (or level) as the top surfaces of the lower contact plugs 104 when viewed from a cross-sectional view.

The bottom electrode BE, the magnetic tunnel junction pattern MTJ, and the top electrode TE may be sequentially stacked on each of the lower contact plugs 104. The bottom electrode BE may be electrically connected to the top surface of a corresponding one of the lower contact plugs 104. Sidewalls of the bottom electrode BE, the magnetic tunnel junction pattern MTJ and the top electrode TE may be aligned with each other. The lower contact plugs 104, the bottom electrode BE, the magnetic tunnel junction pattern MTJ, and the top electrode TE may have widths in a direction parallel to the top surface of the substrate 100 when viewed from a cross-sectional view. The width of each of the lower contact plugs 104 may be greater than those of the bottom electrode BE, the magnetic tunnel junction pattern MTJ, and the top electrode TE. The bottom electrode BE, the magnetic tunnel junction pattern MTJ, and the top electrode TE may be locally disposed on the top surface of each of the lower contact plugs 104 when viewed from a plan view. A portion (e.g., an edge) of the top surface of each of the lower contact plugs 104 may be exposed by the sidewalls of the bottom electrode BE, the magnetic tunnel junction pattern MTJ, and the top electrode TE when viewed from a plan view.

The magnetic tunnel junction pattern MTJ may include the first magnetic pattern 108P, the second magnetic pattern 112P, and the tunnel barrier pattern 110P disposed between the first and second magnetic patterns 108P and 112P. The first magnetic pattern 108P may be provided between the bottom electrode BE and the tunnel barrier pattern 110P, and the second magnetic pattern 112P may be provided between the top electrode TE and the tunnel barrier pattern 110P.

In some example embodiments, as illustrated in FIG. 15, magnetization directions 108a and 112a of the first and second magnetic patterns 108P and 112P may be substantially parallel to an interface between the tunnel barrier pattern 110P and the second magnetic pattern 112P. FIG. 15 illustrates an embodiment in which the first magnetic pattern 108P is a reference pattern and the second magnetic pattern 112P is a free pattern. However, embodiments of the inventive concepts are not limited thereto. Unlike FIG. 15, the first magnetic pattern 108P may be the free pattern and the second magnetic pattern 112P may be the reference pattern. Each of the first and second magnetic patterns 108P and 112P having the parallel magnetization directions 108a and 112a may include a ferromagnetic material. The first magnetic pattern 108P may further include an anti-ferromagnetic material for fixing a magnetization direction of the ferromagnetic material included in the first magnetic pattern 108P.

In some example embodiments, as illustrated in FIG. 16, magnetization directions 108b and 112b of the first and second magnetic patterns 108P and 112P may be substantially perpendicular to the interface between the tunnel barrier pattern 110P and the second magnetic pattern 112P. FIG. 16 illustrates an embodiment in which the first magnetic pattern 108P is a reference pattern and the second magnetic pattern 112P is a free pattern. Alternatively, unlike FIG. 16, the first magnetic pattern 108P may be the free pattern and the second magnetic pattern 112P may be the reference pattern. Each of the first and second magnetic patterns 108P and 112P having the perpendicular magnetization directions 108b and 112b may include at least one of a perpendicular magnetic material (e.g., CoFeTb, CoFeGd, or CoFeDy), a perpendicular magnetic material having the $L1_0$ lattice structure, a CoPt alloy having the HCP lattice structure, or a perpendicular magnetic structure. The perpendicular magnetic material having the $L1_0$ lattice structure may include at least one of FePt having the $L1_0$ lattice structure, FePd having the $L1_0$ lattice structure, CoPd having the $L1_0$ lattice structure, or CoPt having the $L1_0$ lattice structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

The upper interlayer insulating layer 150 may be provided on the lower interlayer insulating layer 102 to cover the bottom electrode BE, the magnetic tunnel junction pattern MTJ, and the top electrode TE. The interconnection line 160 may be provided on the upper interlayer insulating layer 150. The interconnection line 160 may be, for example, a bit line. The interconnection line 160 may extend in a first direction D1 in a plan view and may be electrically connected to a plurality of the magnetic tunnel junction patterns MTJ arranged in the first direction D1. Each of the magnetic tunnel junction patterns MTJ may be electrically connected to the interconnection line 160 through a corresponding top electrode TE. A plurality of the interconnection lines 160 may be arranged along a second direction D2 intersecting the first direction D1 when viewed from a plan view.

Figure 17:
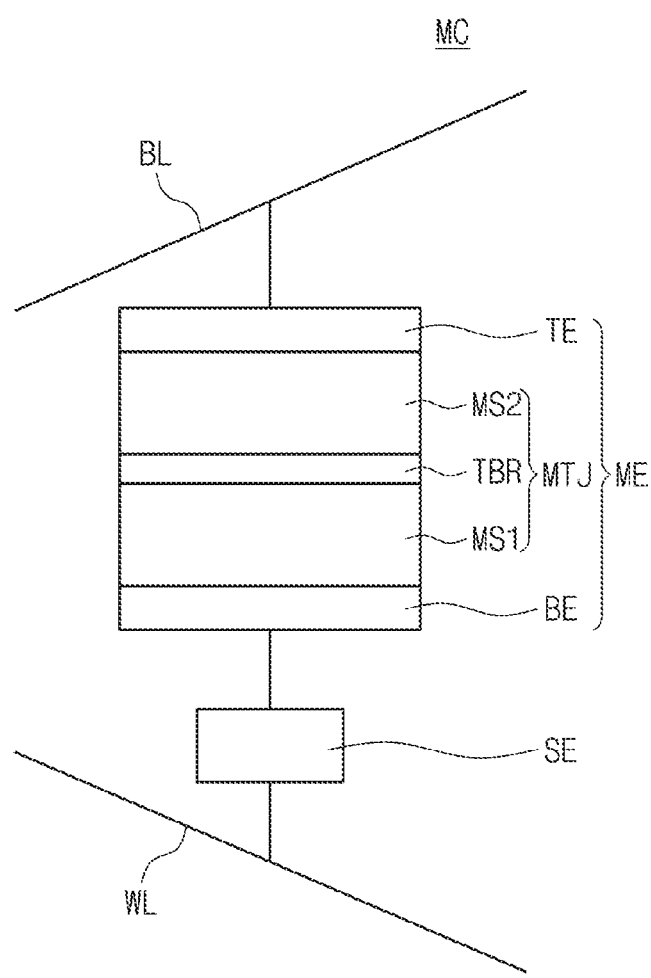
FIG. 17 is a circuit diagram illustrating a unit memory cell of a magnetic memory device manufactured according to some example embodiments of the inventive concepts.

FIG. 17 is a circuit diagram illustrating a unit memory cell of a magnetic memory device manufactured according to some example embodiments of the inventive concepts.

Referring to FIG. 17, a unit memory cell MC may include a memory element ME and a selection element SE. The memory element ME may be connected between a bit line BL and the selection element SE, and the selection element SE may be connected between the memory element ME and a word line WL. The memory element ME may be a variable resistance element of which a resistance state is switchable between two different resistance states by an electrical pulse applied thereto. In some example embodiments, the memory element ME may have a thin-layered structure of which an electrical resistance is changeable using spin transfer torque of electrons of a program current passing therethrough. The memory element ME may have a thin-layered structure showing a magnetoresistance characteristic and may include at least one ferromagnetic material and/or at least one anti-ferromagnetic material. The selection element SE may selectively control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line (not shown) may be connected to the selection element SE.

In some example embodiments, the memory element ME may include a first magnetic structure MS1, a second magnetic structure MS2, and a tunnel barrier TBR disposed between the first and second magnetic structures MS1 and MS2. The first magnetic structure MS1, the second magnetic structure MS2, and the tunnel barrier TBR may constitute a magnetic tunnel junction pattern MTJ. Each of the first and second magnetic structures MS1 and MS2 may include at least one magnetic layer formed of a magnetic material. The memory element ME may further include a bottom electrode BE and a top electrode TE. The bottom electrode BE may be disposed between the first magnetic structure MS1 and the selection element SE, and the top electrode TE may be disposed between the second magnetic structure MS2 and the bit line BL.

Figure 18:
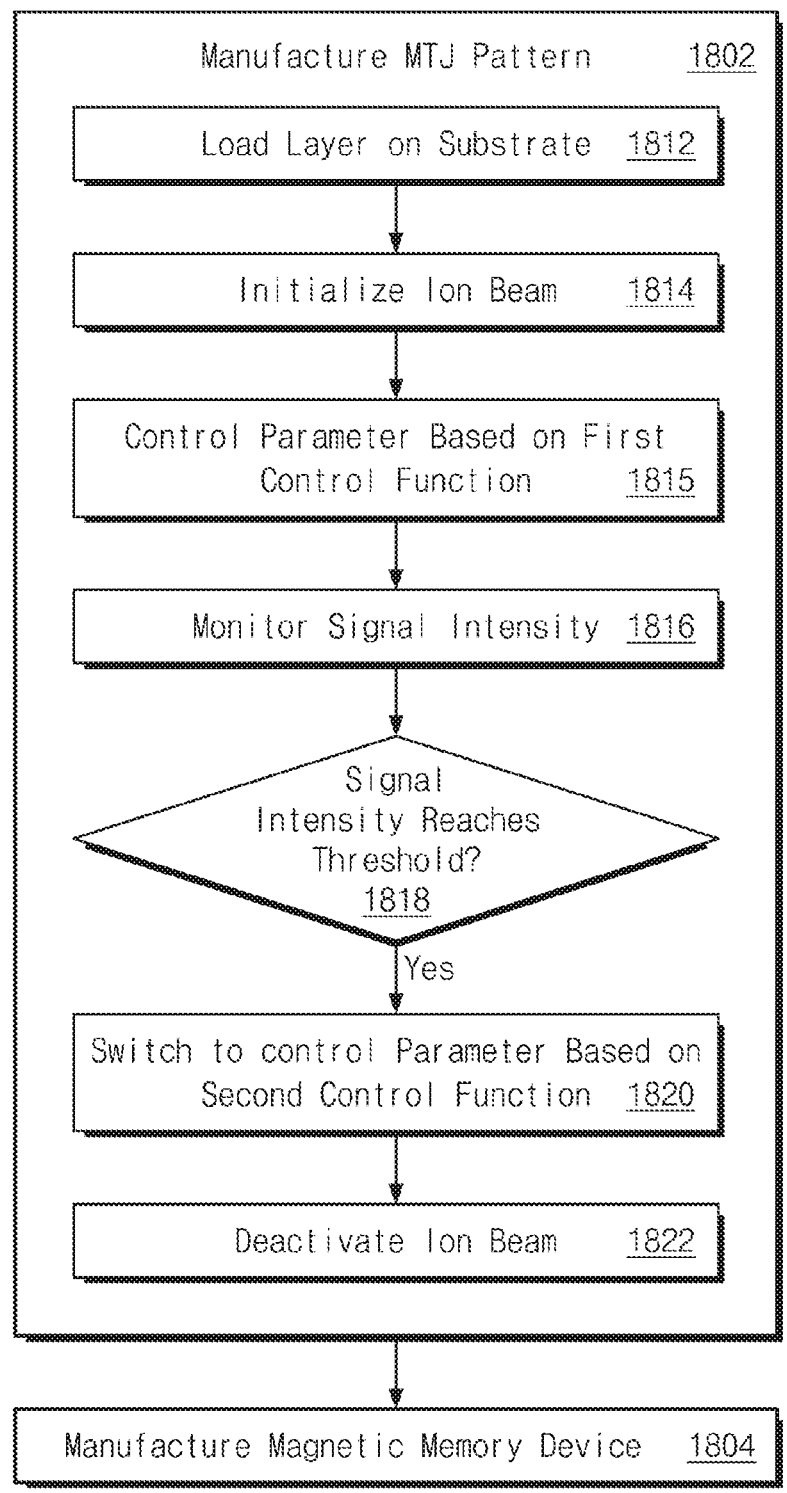
FIG. 18 is a flowchart illustrating ion beam etching control as part of the manufacture of a magnetic memory device according to some example embodiments.

FIG. 18 is a flowchart illustrating ion beam etching control as part of the manufacture of a magnetic memory device according to some example embodiments.

At operation 1802, a Magnetic Tunnel Junction (MTJ) pattern is manufactured. At operation 1804, a magnetic memory device (e.g., an MRAM) is manufactured based on the MTJ pattern, such that the MTJ pattern is incorporated into the manufactured magnetic memory device.

As shown in FIG. 18, operation 1802 may include performing one or more of operations 1812-1822.

At operation 1812, at least one layer is loaded onto a substrate. The substrate may be the substrate 100 included in the chamber assembly 200. In some example embodiments, the at least one layer may include the etch target layer 20 shown in FIG. 6. In some example embodiments, the at least one layer includes at least the magnetic tunnel junction layer 120 illustrated in at least FIG. 10. One or more additional layers, patterns, etc. may be loaded on the at least one layer. The one or more additional layers may include the mask patterns 30, the conductive mask patterns 130, etc.

At operation 1814, an ion beam IB is initialized ("activated") to initiate etching of the at least one layer. At operation 1815, the ion beam etching proceeds wherein at least one parameter associated with the chamber assembly is controlled according to a first control function, such that the ion beam etching of the at least one layer is at least partially controlled based on the first control function. Control of the at least one parameter based on the first control function may include adjusting a set point of the at least one parameter to a value expressed by the first control function. The first control function may express the set point value based on at least one of an amount of elapsed time from a particular point in time (e.g., the point in time at which the ion beam is initialized) and an intensity of the generated signal. In some example embodiments, the first control function may express the set point value as a fixed value over time.

At operation 1816, a signal generated by the at least one layer is monitored for the intensity of the signal. At operation 1818, a determination is made regarding whether the intensity of the signal has at least reached a particular (or, alternatively, predetermined) threshold intensity value. If not, the monitoring at operation 1816 continues. If so, as shown at operation 1820, control of the at least one parameter is switched from being based on the first control function to being based on a different, second control function. Control of the at least one parameter based on the second control function may include adjusting the set point of the at least one parameter to a value expressed by the second control function. The second control function may express the set point value based on at least one of an amount of elapsed time from a particular point in time (e.g., the point in time at which the ion beam is initialized) and an intensity of the generated signal. In some example embodiments, the second control function may express the set point value as a fixed value over time.

At operation 1822, the ion beam is deactivated.

According to some example embodiments of the inventive concepts, while the process using the ion beam is performed in the chamber assembly of the ion beam apparatus, the controller coupled to the ion beam apparatus may control the parameter of the chamber assembly in such a way that the set-point of the parameter is changed continuously with time. Thus, at least one of the ion energy, the ion current, and the incident angle of the ion beam may be changed continuously with time during the process.

When the etching process for forming the patterns on the substrate is performed using the ion beam apparatus, at least one of the ion energy, the ion current, and the incident angle of the ion beam may be controlled to be decreased continuously with time during the etching process. Thus, it is possible to inhibit the top surface of the lower layer between the patterns from being recessed.

Likewise, when the etching process for forming the magnetic tunnel junction patterns on the substrate is performed using the ion beam apparatus, at least one of the ion energy, the ion current, and the incident angle of the ion beam may be controlled to be decreased continuously with time during the etching process. Thus, it is possible to inhibit the top surface of the lower interlayer insulating layer between the magnetic tunnel junction patterns from being recessed. As a result, the lower contact plugs may be easily formed in the lower interlayer insulating layer. In addition, since at least one of the ion energy, the ion current, and the incident angle of the ion beam is changed continuously with time during the etching process, an additional stable time for stabilizing the ion energy, the ion current, and/or the incident angle may not be required in the etching process. Thus, it is possible to prevent defects from occurring by particles generated during the stable time. As a result, embodiments of the inventive concepts may provide the method for manufacturing the magnetic memory device, which is capable of easily manufacturing a magnetic memory device and of minimizing occurrence of defects.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An ion beam apparatus comprising:
   a chamber assembly configured to hold a material, the chamber assembly further configured to direct an ion beam on the material;
   a detector coupled to the chamber assembly, the detector configured to detect a signal generated from the material held in the chamber assembly based on the ion beam being directed on the material; and
   a controller coupled to the chamber assembly and the detector, the controller configured to control at least one parameter associated with the chamber assembly based on the signal, such that at least one of an ion energy associated with the ion beam, an ion current associated with the ion beam, and an incident angle of the ion beam with respect to a top surface of the material is changed continuously with time,
   wherein
   the chamber assembly is configured to hold a substrate, such that the material is held on the substrate and the chamber assembly is configured to direct the ion beam on the material while the material is on the substrate,
   the detector is configured to detect an intensity of the signal generated from the material on the substrate based on the ion beam being directed on the material, and
   the controller is configured to control a continuous adjustment of the at least one of the ion energy, the ion current, and the incident angle during the directing of the ion beam on the material based on the detected intensity of the signal.

2. The ion beam apparatus of claim 1, wherein,
   the controller is configured to determine a specific point in time at which the intensity of the signal reaches a particular threshold intensity value.

3. The ion beam apparatus of claim 2, wherein the controller is configured to control the at least one parameter such that a set-point value of the at least one parameter is changed continuously with time based on a user-defined control function from the specific point in time to a point in time at which the ion beam is deactivated.

4. The ion beam apparatus of claim 3, wherein the controller is configured to control the at least one parameter such that the set-point value of the at least one parameter is fixed from a point in time at which the ion beam is initialized to the specific point in time.

5. The ion beam apparatus of claim 3, wherein,
   the user-defined control function is a first user-defined control function, and
   the controller is configured to control the at least one parameter such that the set-point value of the at least one parameter is changed continuously with time based on a second user-defined control function from a point in time at which the ion beam is initialized to the specific point in time.

6. The ion beam apparatus of claim 1, wherein,
   the controller is configured to control the at least one parameter such that a set-point value of the at least one parameter is changed continuously with time from a specific point in time after the ion beam is initialized to a point in time at which the ion beam is deactivated based at least in part upon on the intensity of the signal.

7. The ion beam apparatus of claim 6, wherein the controller is configured to determine the specific point in time as a point in time at which the intensity of the signal reaches a particular threshold value.

8. The ion beam apparatus of claim 6, wherein the controller is configured to control the at least one parameter such that the set-point of the at least one parameter is fixed from a point in time at which the ion beam is initialized to the specific point in time.

9. The ion beam apparatus of claim 6, wherein the controller is configured to control the at least one parameter such that the set-point value of the at least one parameter is changed continuously with time based on a user-defined control function from a point in time at which the ion beam is initialized to the specific point in time.

10. The ion beam apparatus of claim 1, wherein the chamber assembly includes,
- a source chamber configured to generate a plasma used to generate the ion beam;
- a process chamber including a stage configured to hold the substrate within the process chamber; and
- a grid between the source chamber and the process chamber, the grid configured to control the ion beam irradiated into the process chamber;
- wherein the at least one parameter includes at least one of
  - a magnitude of source power applied to the source chamber,
  - a type of a source gas supplied into the source chamber,
  - a flow rate of the source gas supplied into the source chamber,
  - a magnitude of a grid voltage applied to the grid,
  - a magnitude of a grid current flowing through the grid, and
  - a tilt angle of the stage.

11. The ion beam apparatus of claim 10, wherein the material is a thin layer on the substrate, such that directing the ion beam on the material includes directing the ion beam on the substrate to etch the thin layer on the substrate.

12. The ion beam apparatus of claim 1, wherein the controller is configured to control the continuous adjustment of the incident angle during the directing of the ion beam on the material based on the detected intensity of the signal.

13. The ion beam apparatus of claim 1, wherein
the material includes a lower layer and an etch target layer on the lower layer, and
the detector is configured to detect the signal as a signal generated from the lower layer based on the ion beam being irradiated to a surface of the etch target layer.

* * * * *